US005925410A

United States Patent [19]

Akram et al.

[11] Patent Number: 5,925,410

[45] Date of Patent: Jul. 20, 1999

[54] VIBRATION-ENHANCED SPIN-ON FILM TECHNIQUES FOR SEMICONDUCTOR DEVICE PROCESSING

[75] Inventors: Salman Akram, Boise; Paul D. Shirley, Meridian; William T. Rericha, Boise, all of Id.

[73] Assignee: Micron Technology, Inc., Boise, Id.

[21] Appl. No.: 08/852,144

[22] Filed: May 6, 1997

[51] Int. Cl.[6] .......... B05D 3/12

[52] U.S. Cl. .......... 427/240; 427/385.5; 427/346; 427/422; 427/427; 427/425; 437/231

[58] Field of Search .......... 427/240, 385.5, 427/346, 422, 427, 425; 437/231

[56] References Cited

U.S. PATENT DOCUMENTS

| | | | |
|---|---|---|---|
| 4,518,678 | 5/1985 | Allen | 427/240 |
| 4,633,804 | 1/1987 | Arii | 118/52 |
| 4,668,334 | 5/1987 | Doornveld | 427/240 |
| 5,366,757 | 11/1994 | Lin | 427/9 |
| 5,480,524 | 1/1996 | Oeste | 204/158.2 |
| 5,512,154 | 4/1996 | Rischke et al. | 204/204 |

*Primary Examiner*—Janyce Bell
*Attorney, Agent, or Firm*—Trask Britt & Rossa

[57] ABSTRACT

A method for forming a layer of material, particularly a dielectric material, on a substrate includes the steps of dispensing the material onto the substrate, spinning the substrate to produce a layer of the dispensed material, and vibrating the substrate to eliminate voids and/or gaps in the dispensed material. The dispensed material is hardened and if not sufficiently planar, may be subjected to a planarization step.

34 Claims, 3 Drawing Sheets

VIBRATION-ENHANCED SPIN-ON FILM TECHNIQUES FOR SEMICONDUCTOR DEVICE PROCESSING

BACKGROUND OF THE INVENTION

1. Field of the Invention

This invention relates generally to methods for forming a uniform layer of material on a substrate such, as a semiconductor wafer. More particularly, the invention relates to methods for forming a uniform layer of dielectric material on a semiconductor structure, especially a non-planar semiconductor structure.

2. State of the Art

The fabrication of semiconductor devices involves forming electronic components on semiconductor substrates, such as silicon wafers. These electronic components may include transistors, resistors, and the like, with intermediate and overlying metallization patterns at varying levels which interconnect the electrical components to form circuits. The formation of these circuits results in uneven or non-planar topography on an active surface of the semiconductor device.

Generally during the fabrication of these semiconductor devices, numerous layers of materials are deposited on the active surface of the semiconductor device. Some of the most important layers comprise insulative layers made from dielectric materials. Dielectric materials, such as polymeric materials, such as polyimides, and glasses, such as spin-on-glass (SOG) or other silicon-based glass including boron, phosphorous, and boron/phosphorous silicate glasses, and silicon nitride, are used to form electrically insulative interlevel layers as well as to form final protective (e.g., passivation) coatings over the semiconductor device. These dielectric materials are particularly useful as interlevel layers because they fin in gaps in the non-planar semiconductor device topography, and also generally form self-leveling, highly planar surfaces. The formation of a planar surface may eliminate the need for mechanical or chemical/mechanical planarizing the interlevel layer before depositing additional metallization or electronic components thereon.

Dielectric materials, whether polymeric materials or spin-on-glasses, are usually applied in a fluid state to the semiconductor wafer while the semiconductor wafer is rotated at a constant speed of about 500 to 5000 rpm. The application of the dielectric material is generally complete in a few seconds. Of course, other processes known in the art can be used for applying the dielectric material layer to semiconductor devices, such as chemical vapor deposition (CVD), plasma CVD, extrusion, and sputtering. One problem with these processes is that very specialized equipment and procedures are required. Furthermore, these processes and equipment used in these processes may be incompatible with the manufacturing conventions in use.

Current trends in size reduction of semiconductor devices leading to tighter or lower pitches and higher aspect ratios are making the current methods of applying layers of materials, particularly dielectric materials, unworkable. First, a greater number of layers of electronic components, sometimes five or more, are being applied to a substrate surface which increases the height of the circuit topography on the substrate surface. Second, metallization patterns are becoming more dense due to the lower pitch, with less lateral space between conductive traces. Third, in order to accommodate the greater density of conductive traces in the metallization pattern, the width of the conductive traces must be reduced. However, to compensate for the reduced conductive trace width, the thickness or height of the conductive traces must be proportionately increased to maintain the requisite current through the conductive traces.

These trends combine to produce very high aspect ratios (height of a circuit element or combination of elements in comparison to the width or valley between adjacent elements or combination of elements) in the topography of the semiconductor device. However, the high aspect ratio topography may cause (a) non-conformal penetration of the layering material which results in portions of the valleys being devoid of dielectric material; (b) the formation of small gas-filled bubbles or "voids" in the layering material resulting from gas in the valleys becoming trapped during the application of the layering material thereby entraining the bubbles in the dielectric layer; and (c) the formation of non-planar (non-uniform) dielectric layer surface topography.

FIG. 5 illustrates a simplified cross-sectional view of a high aspect ratio semiconductor device 200 which has been prepared by a prior art method. One or more layers of metallization or other materials 202, together with a silicon oxide layer 204, form projections 206 on a surface 208 of a substrate 210. Thus, projections 206 create a non-planar semiconductor surface 212. A layer of dielectric material 214 is shown as applied to the non-planar semiconductor surface 212 by a conventional spinning process. For reasons discussed above, the dielectric material 214 may not flow into the valleys 216 between the projections 206. This results in either the formation of small gas-filled bubbles or "voids" 218 in the dielectric material 214, or the formation of areas of non-conformal penetration or gaps 220 in the dielectric material 214 over the valleys 216. Furthermore, the result of this prior art technique is generally a non-planar top surface 222.

If the dielectric material, whether as an intermediate layer or final coating, fails to fully cover portions of the semiconductor device, the device may fail to meet the required test specifications, and thus must be discarded. Such loss is expensive and highly undesirable. Additionally, the formation of gas-filled "voids" is troublesome since it results in non-uniform insulative properties in the dielectric material which may not manifest themselves during burn-in or testing, but only during long term operation. Furthermore, when portions of the semiconductor device are exposed to any oxygen present in a trapped gas bubble, chemical reactions and degradation of a component may result. This oxidation may cause premature failure of the semiconductor device. Moreover, non-planarity of an intermediate dielectric surface necessitates a further step of planarization before further electronic components can be formed on the intermediate dielectric surface. The addition of the planarization step increases the cost of semiconductor device fabrication, which, in turn, increases the cost of the semiconductor device.

Therefore, it would be advantageous to develop a technique for forming uniform material layers, particularly planar dielectric material intermediate and final coating layers, on a semiconductor device which are substantially devoid of gaps and/or voids, while using inexpensive, commercially-available, widely-practiced semiconductor device fabrication techniques and apparatus and without requiring complex processing steps.

SUMMARY OF THE INVENTION

The present invention relates to methods for the manufacture of semiconductor devices with substantially no entrainment of gas as minute bubbles or "voids", or gaps in material layers, such as intermediate and final dielectric material coatings, to improve the reliability and reduce the reject rate of the semiconductor devices. Moreover, the methods of the present invention also create a substantially planar upper surface on the dielectric material coating which can eliminate the need to subsequently planarize the applied dielectric material coating.

For the sake of convenience, the present disclosure will focus on dielectric materials as the layering materials. However, it is understood that the present invention is applicable to any material layered during the fabrication of a semiconductor device.

The various methods of the present invention include the following steps:

a. dispensing a fluid dielectric material on a surface of an unfinished semiconductor device;

b. spinning the unfinished semiconductor device to distribute the fluid dielectric material over the unfinished semiconductor device surface; and c. vibrating the unfinished semiconductor device having the fluid dielectric material distributed thereon to transmit vibrational energy to any gas bubbles in the fluid dielectric material and to the fluid dielectric material to close any gaps.

Each of steps a, b, and c is a necessary process of the present invention. However, the sequence of the spinning and vibrating steps after dispensing the fluid dielectric material may be reversed. Furthermore, the steps may be combined. Thus, steps a and b, steps a and c, or steps a, b, and c may be performed concurrently.

Other optional steps include additional spinning, hardening the dielectric layer, removing the edge bead, soft baking the dielectric layer, and planarization, each step being further described in the Detailed Description of the Preferred Embodiments, infra.

The methods of the present invention are particularly useful for coating substrate surfaces having non-planar structures with high aspect ratios (e.g., greater than about 3), since the valley structures with high aspect ratios tend to trap in air when the fluid dielectric material is deposited. This trapped air, in turn, causes the voids and gaps to form in the dielectric material Conventional methods for forming dielectric material coatings are unable to eliminate gas voids and gaps from such coatings.

A distinct advantage of the methods of the present invention is that the methods can be implemented with minor modifications (i.e., the attachment of vibration means and optionally a heat/cool mechanism) to conventional apparatus, such as a coat track apparatus.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

For the sake of convenience, the present detailed description of preferred embodiments will focus on dielectric materials as the layering materials. However, it is understood that the present invention is applicable to any material layered during the fabrication of a semiconductor device.

As used herein, the term "dielectric materials" refers to materials having electrical insulating properties and which may be applied to a surface as a fluid to flow into a film under centrifugal and gravitational forces. Dielectric materials particularly useful in the manufacture of semiconductor devices include polymeric materials, such as polyimides, as well as various spin-on-glasses (SOG), including silicate glasses, such as borosilicate glass (BSG), phosphosilicate glass (PSG), and borophosphosilicate glass (BPSG). The methods of the invention may be used, for example, to form a dielectric layer on a substrate during an intermediate manufacturing step, as well as, to form a final insulating (i.e., passivation) coating on the semiconductor device.

The term "semiconductor substrate" is used herein to denote any solid semiconductor surface, such as a silicon wafer or a silicon layer formed on glass, ceramic, sapphire, or other supporting carrier, as known in the art, to which a dielectric material may be applied. Other suitable semiconductor materials include gallium arsenide and indium phosphide. Thus, for example, the dielectric material may be applied to a raw wafer surface, to a wafer having various electronic components including transistors, resistors, conductive patterns, and the like, formed thereon, and/or to a finished wafer or chip as a final protective coating. Typically, final coatings of dielectric material may be applied at a greater thickness than intermediate dielectric layers.

FIGS. 1–4 illustrate various methods of the present invention. It should be understood that the figures presented as cross-sectional views in conjunction with this description are not meant to be actual cross-sectional views of any particular portion of an actual semiconducting device, but are merely idealized representations which are employed to more clearly and fully depict the process of the invention than would otherwise be possible.

Figure 1:
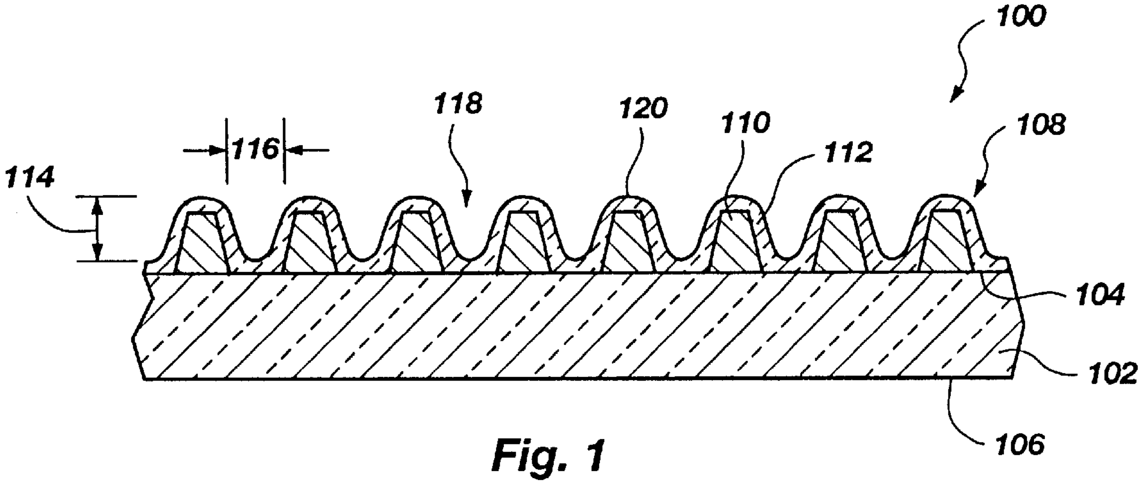
FIG. 1 is a cross-sectional side view of part of a substrate having a non-planar topography including projecting structures to be coated with a layer of dielectric in accordance with methods of the invention.

FIG. 1 illustrates an unfinished or intermediate semiconductor device 100 (hereinafter "device 100") to be further processed by a method of the present invention. The device 100 comprises a semiconductor substrate 102 having a top surface 104 and a bottom surface 106 and also including a plurality of projections 108 formed on the substrate top surface 104. The projections 108 illustrated include metallization lines or conductive traces 110 with a silicon oxide layer 112 deposited thereon, forming an uneven device upper surface 120. It is, of course, understood that the conductive traces 110 forming the projections 108 are merely exemplary of electronic components and structures or elements of components including capacitors, transistor gates, and the like.

As used herein with respect to FIG. 1 for exemplary purposes, the aspect ratio is defined as the ratio of depth 114 to width 116 of valleys 118 between adjacent projections 108. It is, of course, understood that the valleys 118 may have irregular surfaces and/or differ dimensionally from valley to valley; thus, a value of the aspect ratio may differ from structure to structure. Valleys 118 having high aspect ratios are typically the most likely to form voids and gaps in any coating applied thereto (as shown in prior art FIG. 5).

Figure 2:
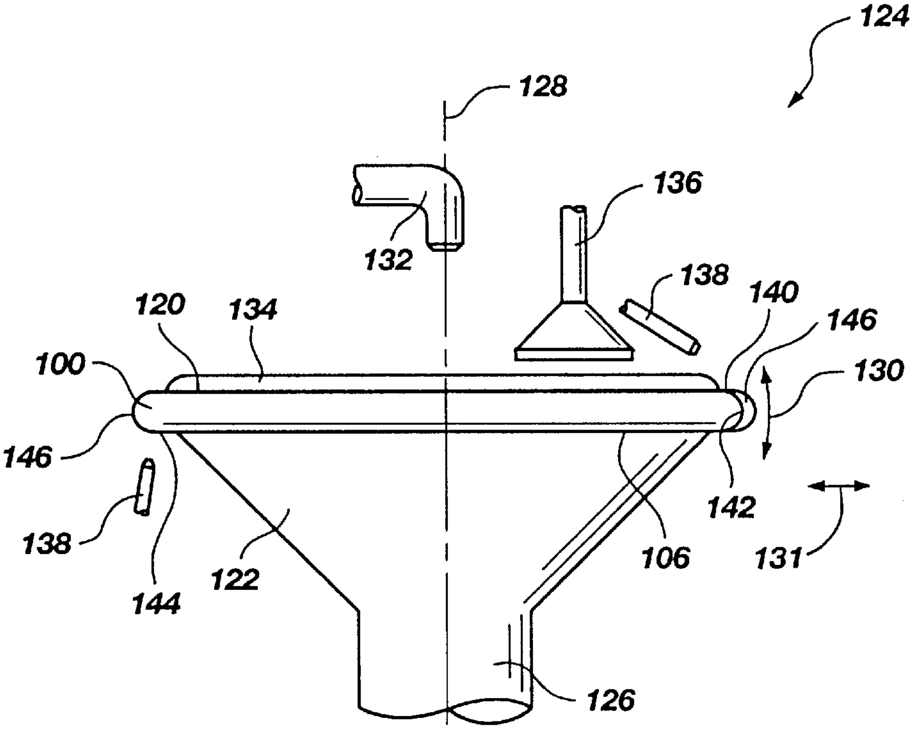
FIG. 2 is a schematic side elevation view of an apparatus for coating a layer of dielectric on a substrate in accordance with the method of the invention.

As shown in FIG. 2, the device 100 is attached to a chuck 122 of a wafer coat track 124 (or spin coater). The chuck 122 preferably includes a vacuum mechanism (not shown) for removably attaching the semiconductor substrate bottom surface 106 to the chuck 122 using a vacuum force. The coat track 124 includes a spindle 126 attached to a motor (not shown) adapted to rotate the chuck 122 and the device 100 about axis 128 at speeds of from 0 to about 10,000 rpm. In accordance with the present invention, the spindle 126 is also adapted to vibrate the chuck 122 and the device 100, such as an up and down vibrational motion, as indicated by arrow 130, a side to side vibrational motion, as indicated by arrow 131, or any combination of such vibrational motions. The vibrational motion of the chuck 122 can be achieved by modification of a standard coat track 124 to include a vibratory motor (not shown) that is mechanically coupled to the spindle 126. For example, a Model No. 8800 coat track manufactured by Silicon Valley Group can be modified by a person skilled in the art such that the spindle 126 can be selectively vibrated at a frequency of up to about 10,000 cycles/second.

The coat track 124 also includes a dispensing nozzle 132 for dispensing dielectric material 134 onto the device upper surface 120. The dielectric material 134 is preferably a glass melt which solidifies upon cooling, or a polymeric material which solidifies upon heating.

The coat track 124 may be located within a chamber (not shown) for maintaining a particular gaseous atmosphere and/or desirable temperature/pressure conditions.

As shown, the coat track 124 may include a heating/cooling device 136 for heating by convection or radiation, or for cooling by convection. In addition, the coat track 124 may be fitted with nozzles 138 positioned at a topside portion 140 of a circumferential edge 142 of the device 100 and/or at a bottom portion 144 of the circumferential edge 142 of the device 100. A solvent or abrasive mixture (not shown) is directed through the nozzles 138 while the device 100 is spinning at speeds from about 200 to 5000 rpm. The solvent/abrasive mixture removes any dielectric material 134 which may accumulate as an edge bead 146 on the unfinished semiconductor device circumferential edge 142, and washes any dielectric material 134 from the circumferential edge bottom portion 144.

Figure 4:
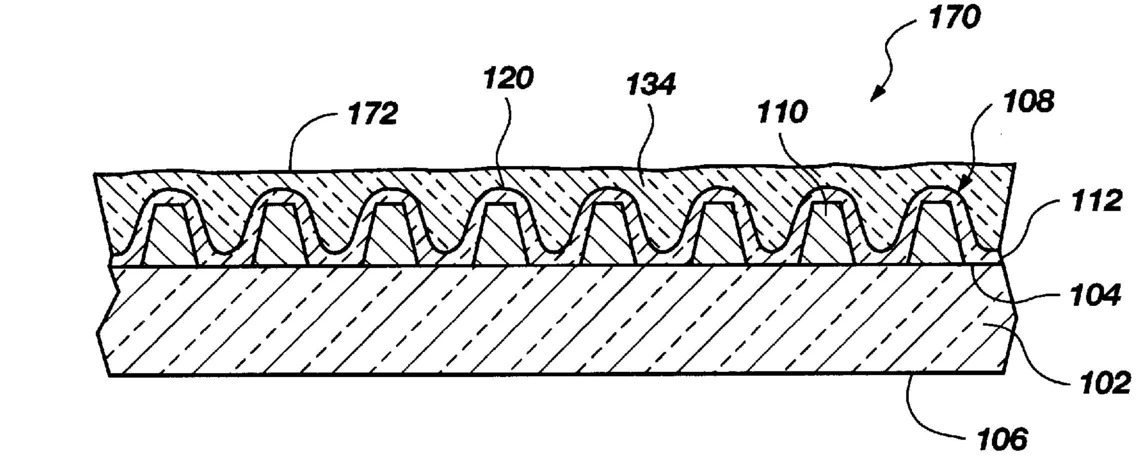
FIG. 4 is a cross-sectional side view of part of a substrate having a non-planar topography including projecting structures coated with a layer of dielectric in accordance with methods of the invention.

In FIG. 4, a semiconductor device 170 is shown as having a layer of dielectric material 134 formed on the non-planar unfinished device upper surface 120 by a method of the present invention. An absence of voids and gaps (shown as the voids 218 and gaps 220 in prior art FIG. 5) in the applied dielectric material 134 is attributable to the use of high frequency vibration in the dielectric material application process. The use of vibration transfers energy to gases in the voids (voids 218—FIG. 5) which drives such gases from the dielectric material 134, vibrates the dielectric material itself which facilitates flow of the dielectric material 134 into the gaps (gaps 220—FIG. 5), and also enhances the planarity of the upper surface 172 of the dielectric material 134.

Figure 5:
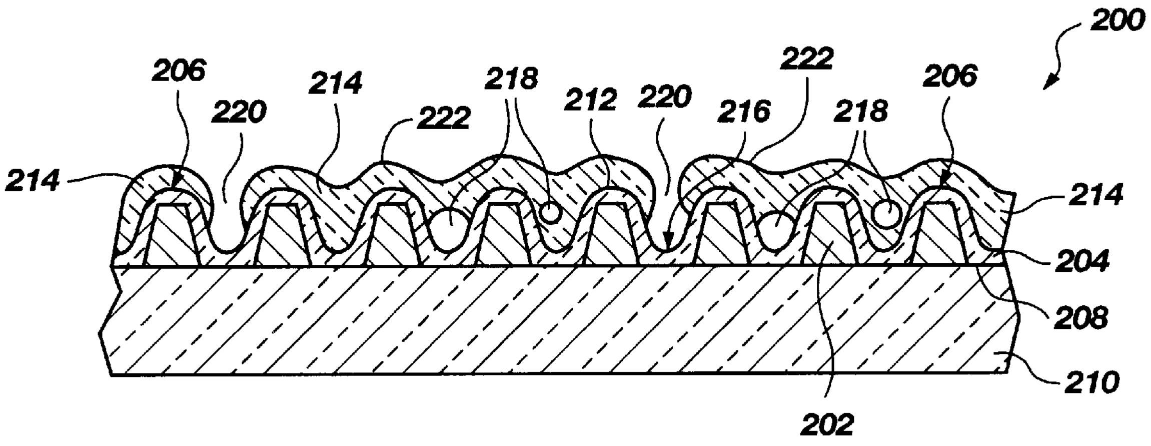
FIG. 5 is a cross-sectional side view of part of a substrate having a non-planar topography including projecting structures coated with a layer of dielectric in accordance with methods of the prior art.

We now turn to the particular methods for forming a uniform dielectric coating 134 on the device 100 without the voids or gaps, as shown in prior art FIG. 5.

Figure 3:
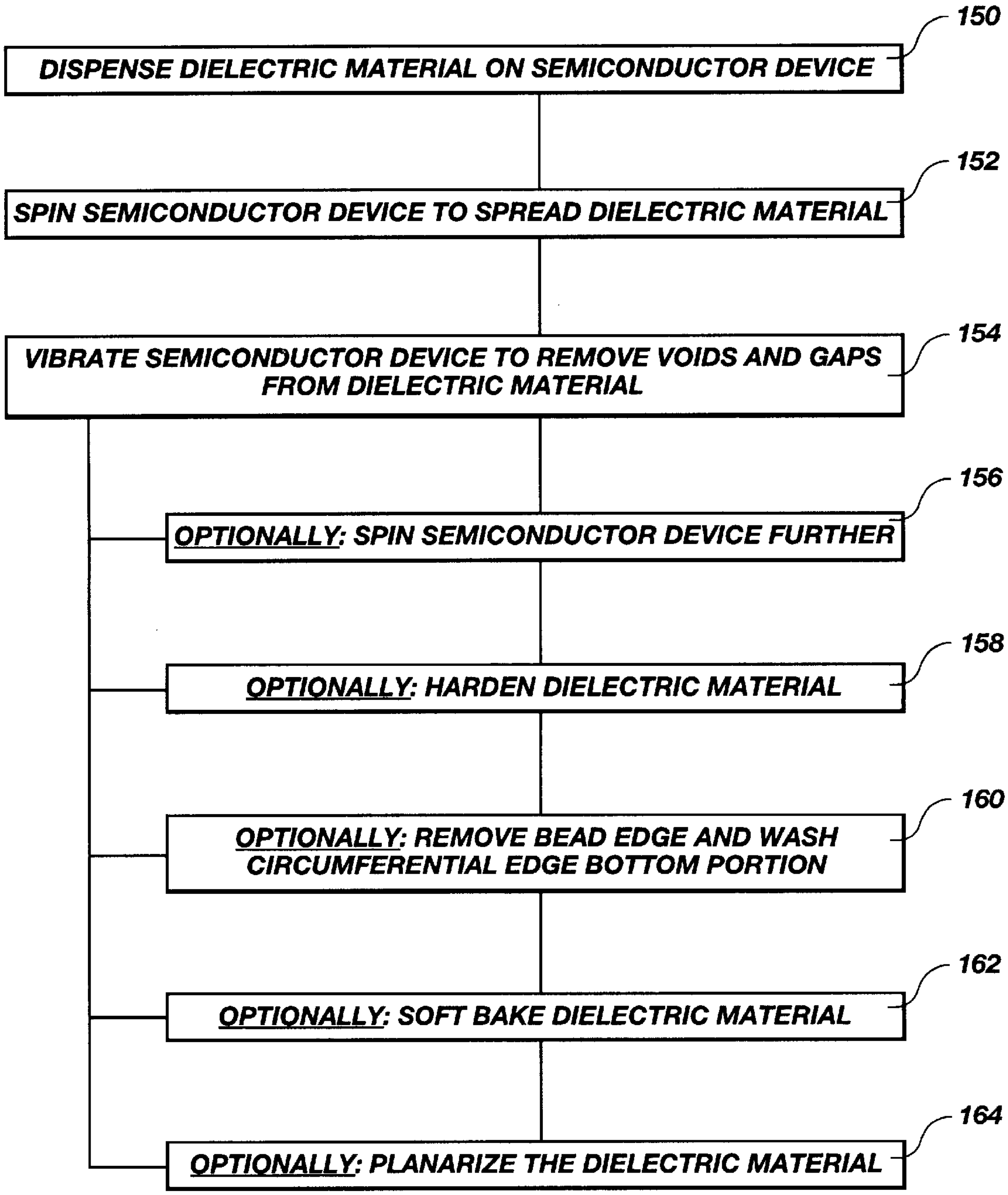
FIG. 3 is a block diagram of the process steps included in methods of the invention.

The steps of a method of one embodiment of the present invention are shown in FIG. 3. The particular order of steps shown in FIG. 3 is not intended to be limiting, but to show a variety of sequences which have particular utility within the context of the present invention. The methods include the steps of: dispensing a fluid dielectric material 134 on the device 100, step 150; spinning the device 100 to spread the fluid dielectric material 134, step 152; and vibrating the dielectric material 134 covered device 100 to fill any voids or gaps in with dielectric material 134, step 154.

The dispensing step 150 can be performed by flooding the upper exposed surface of the entire device 100 prior to the spin step 152, or by dispensing a small volume of fluid dielectric material 134 near the axis of rotation 128 (as shown in FIG. 2) at the center of the device 100 while the device 100 is spun at speeds of about 500 to 5000 rpm for several seconds. This operation is known as a spread cycle. Applying fluid dielectric material 134 while spinning may be particularly useful for glass dielectric materials, to prevent premature cooling at the center of the device 100 which could result in non-uniform spreading of the dielectric material 134. Additionally, a heating/cooling device 136 (see FIG. 2) may be used during the dispensing step 150 and/or during the following steps 152 and 154 to maintain a desired, substantially uniform temperature (and thus viscosity) of the dielectric material 134 (e.g., glass melt or fluid polymer) over the entire device 100. In some cases, it may be desirable to apply a coating of a primer material to the device upper surface 120 prior to applying the dielectric material 134 to enhance the adhesion of the dielectric material 134 to the device upper surface 120.

In the situation where the fluid dielectric material 134 is dispensed on a non-spinning device 100, dispensing is followed by the spin step 152 which rapidly accelerates the device 100 to a spin speed, thereby spreading the dielectric material 134 as a uniform layer across the device upper surface 120. For example, the device 100 may be spun for between about 1 and 60 seconds at a speed of between about 500 and 5000 rpm.

Next, the device 100 is subjected to the vibration step 154 by which any voids or gaps present in the applied dielectric material 134 are displaced by adjacent dielectric material 134 adjacent to the voids and gaps. In addition, the vibrational energy produces a more uniform distribution of dielectric material in the valleys 118 which is seen in the illustration of a semiconductor device 170 formed by a method of the present invention shown in FIG. 4. The vibration step 154 may be conducted for about 1 to 60 seconds at a vibration frequency of about 1 to 10,000 cycles per second. A preferable vibrational frequency range lies between about 60 and 5000 cycles per second.

Optionally, the device 100 may be spun during the vibration step 154. For example, rotation may be at a relatively low speed such as about 10 to 100 rpm.

As a further option, the dispensing step 150 may be conducted while both spinning at a relatively low speed and vibrating at about 1 to 5000 cycles per second.

The viscosity of the fluid dielectric material 134 must be controlled to allow the dielectric material 134 to be easily distributed during vibration but without spinning or dripping entirely off the device 100. The dielectric material 134 viscosity and the spin speed are primary factors in determining the final thickness of the solidified layer of dielectric material 134, as shown in FIG. 4. The viscosity of polymeric-type dielectric materials 134, such as polyimides, is dependent primarily upon its solids content and temperature. For glass dielectric materials, the viscosity is primarily a function of temperature. For polymeric dielectric materials to be applied to substrates having non-planar topographies, a desirable range of viscosity will typically be about 1 to 100 centistokes, with the lower viscosities more applicable to devices 100 having very high aspect ratios in their topography. For melts of glass dielectric materials, a desirable range of viscosity will generally be between about 1 and 20 centistokes typically achieved at melt temperatures of about 100 to 400 degrees C.

Following the vibration step 154, the device 100 and applied dielectric material 134 may be further spun for a time period in optional step 156. The length of this spin step 156 may extend up to about 100 seconds. With glass dielectrics, some cooling may be performed, with concurrent hardening. In some cases, a separate hardening step 158 without spinning may be conducted. For example, glass dielectrics may be simply cooled, while reactive polymeric dielectrics may be heated in an oven to complete the desired degree of polymerization.

In a further optional step 160, an edge bead 146, as shown in FIG. 2, formed on the device circumferential edge 142 may be removed and/or the circumferential edge bottom portion 144 washed clean of dielectric material 134. This step is preferably used when the dielectric material 134 comprises a polymer. Step 160 is preferably conducted when the dielectric material viscosity is such that a stream of solvent or abrasive mixture will quickly remove the edge bead 146 and the edge bead 146 will not re-form. Edge bead removal and bottom portion wash can be accomplished by directing a solvent/abrasive slurry through nozzles 138 at the device circumferential edge 142 and the circumferential edge bottom portion 144 while at the same time, the device 100 is spun at a speed of about 200 to 5000 rpm.

Where the dielectric material (e.g., a polymer) is hardened by baking, a hardening step 158 may be performed, either before or following step 160. Thus, a polyimide dielectric may be hardened by heating for 1 to 3600 seconds at a temperature of about 50 to 400 degrees C. When the dielectric material 134 (e.g., a glass) is hardenable by cooling, hardening step 158 comprises cooling.

A soft baking step 162 may be conducted to drive solvents from a polymeric dielectric material 134 and to improve adhesion between the dielectric material 134 and the device upper surface 120. The soft baking step 162 also acts as an annealing step to relieve stresses which may have developed in the dielectric material 134. The device 100 and dielectric material 134 are heated to a temperature of about 50 to 300 degrees C. for about 5 to 200 seconds. The soft baking step 162 can be conducted by using a hot plate, convection oven, infrared oven or other radiative heating device. The soft baking step 162 may be used to partially harden a polymeric dielectric material 134 prior to removing the edge bead 146 in step 160.

Where the hardened dielectric material 134 is not sufficiently planar for a subsequent step such as metallization, the hardened dielectric material 134 may be subjected to an abrasive planarizing step 164 such as chemical-mechanical planarization (CMP) to remove raised locations on the dielectric material 134.

In another embodiment of the invention, vibration step 154 precedes the spinning step 152.

In a further embodiment of the invention, the dispensing step 150 is conducted while spinning the substrate.

In yet another embodiment of the invention, the vibration step 154 is conducted during the spinning step 152.

In an additional embodiment, steps 150, 152 and 154 may be conducted simultaneously.

As described herein, the invention provides methods for forming a layer of dielectric on non-planar topography while eliminating voids in the dielectric layer and producing a more planar layer with greater integrity.

Having thus described in detail preferred embodiments of the present invention, it is to be understood that the invention defined by the appended claims is not to be limited by particular details set forth in the above description, as many apparent variations are possible without departing from the spirit or scope thereof.

What is claimed is:

1. A method for forming a uniform material layer on a semiconductor substrate, comprising:

dispensing a flowable layering material onto said semiconductor substrate;

spinning said semiconductor substrate to spread said layering material on said semiconductor substrate; and vibrating said semiconductor substrate at a frequency equal to or less than about 10,000 cycles per second to eliminate voids and gaps in said layering material.

2. The method of claim 1, wherein said spinning of said semiconductor substrate occurs during said dispensing.

3. The method of claim 1, wherein said spinning of said semiconductor substrate occurs during said vibrating.

4. The method of claim 1, wherein said vibrating of said semiconductor substrate occurs during said dispensing.

5. The method of claim 1, wherein said spinning and vibrating of said semiconductor substrate occurs during said dispensing.

6. The method of claim 1, further comprising hardening said layering material.

7. The method of claim 1, further comprising spinning said semiconductor substrate following said vibrating.

8. The method of claim 1, further comprising removing an edge bead of said layering material from said semiconductor substrate following said vibrating.

9. The method of claim 1, further comprising washing a bottom portion of said semiconductor substrate following said vibrating.

10. The method of claim 1, further comprising soft baking said layering material following said vibrating.

11. The method of claim 1, wherein said dispensing, spinning and vibrating are conducted at a controlled temperature.

12. The method of claim 1, wherein said dispensing, spinning and vibrating are conducted at a controlled pressure.

13. The method of claim 1, wherein said dispensing, spinning and vibrating are conducted in a controlled atmosphere.

14. The method of claim 1, further comprising planarizing said layering material.

15. The method of claim 14, wherein said planarization comprises chemicalmechanical planarization.

16. The method of claim 1, wherein said layering material comprises a dielectric material.

17. The method of claim 16, wherein said dielectric material comprises a melt of a glass material.

18. The method of claim 16, wherein said hardenable fluid dielectric material comprises a polymeric dielectric material.

19. The method of claim 18, wherein said polymeric dielectric material comprises a polyimide material.

20. A method for forming a dielectric layer on a substrate bearing at least one semiconductor device, comprising:

providing said substrate having a non-planar surface topography including at least one structure with an aspect ratio greater than about 3;

dispensing a hardenable fluid dielectric material onto said substrate;

spinning said substrate to spread said hardenable fluid dielectric material on said substrate;

vibrating said substrate at a frequency equal to or less than about 10,000 cycles per second to eliminate voids and gaps in said hardenable fluid dielectric material; and solidifying said hardenable fluid dielectric material.

21. The method of claim 20, wherein said spinning of said substrate occurs during said dispensing.

22. The method of claim 20, wherein said vibrating of said substrate occurs during said dispensing.

23. The method of claim 20, wherein said spinning of and said vibrating of said substrate occurs during said dispensing.

24. The method of claim 20, wherein said substrate is spun at about 1 to about 2000 rpm during said vibrating.

25. The method of claim 20, wherein said non-planar substrate surface topography includes electronic components; and wherein said hardenable fluid dielectric material covers said electronic components.

26. The method of claim 20, wherein said hardenable fluid dielectric material comprises a melt of a glass material.

27. The method of claim 20. wherein said hardenable fluid dielectric comprises a polymeric dielectric material.

28. The method of claim 27, wherein said polymeric dielectric material comprises a polyimide material.

29. The method of claim 20, wherein said spinning of said substrate occurs at a rate between about 1000 and about 6000 rpm.

30. The method of claim 20, wherein said dispensing, spinning and vibrating are conducted at a controlled temperature.

31. The method of claim 20, wherein said dispensing, spinning and vibrating are conducted at a controlled pressure.

32. The method of claim 20, wherein said dispensing, spinning and vibrating are conducted in a controlled atmosphere.

33. The method of claim 20, further comprising planarizing said hardenable fluid dielectric material.

34. The method of claim 33, wherein said planarizing comprises chemical-mechanical planarization.

* * * * *

UNITED STATES PATENT AND TRADEMARK OFFICE

CERTIFICATE OF CORRECTION

PATENT NO. : 5,925,410
DATED : July 20, 1999
INVENTOR(S) : Akram et al.

It is certified that error appears in the above-identified patent and that said Letters Patent is hereby corrected as shown below:

| | | | |
|---|---|---|---|
| | Column 1, | line 8 | after "such" delete the comma; |
| | Column 1, | line 35, | change "fin" to --fill--; |
| | Column 3, | line 43, | after "material" insert a period; |
| Claim 15, | Column 8, | line 57, | change "chemicalmechanical" to --chemical-mechanical--; |
| Claim 23, | Column 9, | line 16, | delete "of" (2nd occurrence) after "spinning"; and |
| Claim 27, | Column 10, | line 4, | after "dielectric" (1st occurrence) insert --material--. |

Signed and Sealed this

Twenty-first Day of November, 2000

*Attest:*

Q. TODD DICKINSON

*Attesting Officer*

*Director of Patents and Trademarks*